(12) United States Patent
Sugiyama et al.

(10) Patent No.: US 9,955,594 B2
(45) Date of Patent: Apr. 24, 2018

(54) OPERATION DEVICE

(71) Applicant: DENSO WAVE INCORPORATED, Chita-gun, Aichi-pref. (JP)

(72) Inventors: Wataru Sugiyama, Chita-gun (JP); Yuya Morita, Chita-gun (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 0 days.

(21) Appl. No.: 15/180,664

(22) Filed: Jun. 13, 2016

(65) Prior Publication Data
US 2017/0018387 A1 Jan. 19, 2017

(30) Foreign Application Priority Data

Jul. 13, 2015 (JP) .................................. 2015-139721
Apr. 12, 2016 (JP) .................................. 2016-079580

(51) Int. Cl.
| | |
|---|---|
| *H01H 59/00* | (2006.01) |
| *H05K 5/00* | (2006.01) |
| *H01H 25/00* | (2006.01) |
| *H01H 9/18* | (2006.01) |
| *H01H 23/14* | (2006.01) |

(52) U.S. Cl.
CPC .......... *H05K 5/0017* (2013.01); *H01H 25/008* (2013.01); *H01H 9/181* (2013.01); *H01H 23/143* (2013.01); *H01H 2239/058* (2013.01)

(58) Field of Classification Search
CPC .......... H01H 9/04; H01H 3/02; H01H 25/008; H05K 5/0017
USPC ... 200/181, 302.1, 339, 17 R, 5 R, 341, 520, 200/553, 557, 558, 562, 329, 18, 6 R, 200/6 A; 345/177
See application file for complete search history.

(56) References Cited

U.S. PATENT DOCUMENTS

| | | | | |
|---|---|---|---|---|
| 4,551,660 | A | * | 11/1985 | Suzuki .................. H01H 3/503 200/12 |
| 5,426,275 | A | * | 6/1995 | Maeda .................. B60R 16/02 200/339 |
| 8,399,783 | B2 | * | 3/2013 | Konno ................ H01H 25/041 200/5 R |
| 2005/0109591 | A1 | * | 5/2005 | Van Vooren ......... H01H 23/003 200/1 B |
| 2008/0230360 | A1 | * | 9/2008 | Wada .................... H01H 23/30 200/339 |

(Continued)

FOREIGN PATENT DOCUMENTS

JP 2014-190566 A 10/2014

*Primary Examiner* — Edwin A. Leon
*Assistant Examiner* — Iman Malakooti
(74) *Attorney, Agent, or Firm* — Oliff PLC

(57) ABSTRACT

An operation device driven by an internal battery includes: a casing; an operation element; a mechanical switch; a pressing part; and a support part. The operation element is located on a plane continuing from a front surface of the casing. The mechanical switch is disposed in the casing such that a distance between the mechanical switch and the operation element is fixed. The mechanical switch has a flexible region located to oppose to a rear surface of the casing. The pressing part is located between the mechanical switch and an attachment surface, and presses the flexible region from a side opposite from the operation element. The support part supports the casing such that a distance between the operation element and the attachment surface is changeable.

5 Claims, 8 Drawing Sheets

(56) References Cited

U.S. PATENT DOCUMENTS

2012/0103773 A1\* 5/2012 Villain ................ G06F 3/03547
200/344

\* cited by examiner

OPERATION DEVICE

CROSS REFERENCE TO RELATED APPLICATION

This application is based on Japanese Patent Application No. 2015-139721 filed on Jul. 13, 2015, and Japanese Patent Application No. 2016-079580 filed on Apr. 12, 2016, the disclosures of which are incorporated herein by reference in their entirety.

TECHNICAL FIELD

The present disclosure relates to an operation device.

BACKGROUND

An apparatus is operated through an operation device such as a remote control for television, which is used by a hand of a user. JP 2014-190566 A describes an operation device for air-conditioner, which is used in a state where the operation device is attached to an attachment surface such as a wall.

SUMMARY

In case where an operation device is used at home, an appearance of the operation device may be important. For example, a flat front surface may be a preferred choice as an appearance of a casing on which an operation element is arranged, because a crud easily adheres to a depression in the operation element when a user operates the operation device with a finger. A crud can be prevented from being accumulated on the operation element by forming the front surface of the operation element flat.

However, if the operation element is configured by a general mechanical switch such as membrane switch or push switch, it is difficult to flatten the front surface of a casing. In the case of a mechanical switch, a crud easily stays because a difference in the level is generated relative to the front surface of the casing.

If the operation element is configured by an electrostatic switch, the front surface of a casing can be formed plane. However, it is always necessary to detect whether the electrostatic switch is operated or not, such that the battery becomes exhausted too quickly.

It is an object of the present disclosure to provide an operation device in which a battery is restricted from being exhausted too quickly while a good appearance can be kept.

According to an aspect of the present disclosure, an operation device that is driven by an internal battery includes: a casing; an operation element; a mechanical switch; a pressing part; and a support part. The operation element is located on a plane continuing from a front surface of the casing. The mechanical switch is disposed in the casing such that a distance between the mechanical switch and the operation element is fixed. The mechanical switch has a flexible region located to oppose to a rear surface of the casing. The pressing part is located between the mechanical switch and an attachment surface. The pressing part presses the flexible region from a side opposite from the operation element. The support part supports the casing such that a distance between the operation element and the attachment surface is changeable.

Thereby, the front surface of the casing on which the operation element is disposed can be formed flat. In this case, a large level difference is not generated between the operation element and the front surface, such that a crud is restricted from adhering to the operation element. Moreover, the front surface of the casing can be easily cleaned by wiping. Therefore, a good appearance can be kept.

Moreover, since the mechanical switch detects an operation to the operation element, it is not always necessary to detect whether an electrostatic switch is operated. Thereby, the power consumption of electric circuit such as control part can be sharply reduced. Therefore, the consumption of the internal battery can be reduced, such that user's burden such as replacement of a battery can also be reduced due to the long battery life.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1A:
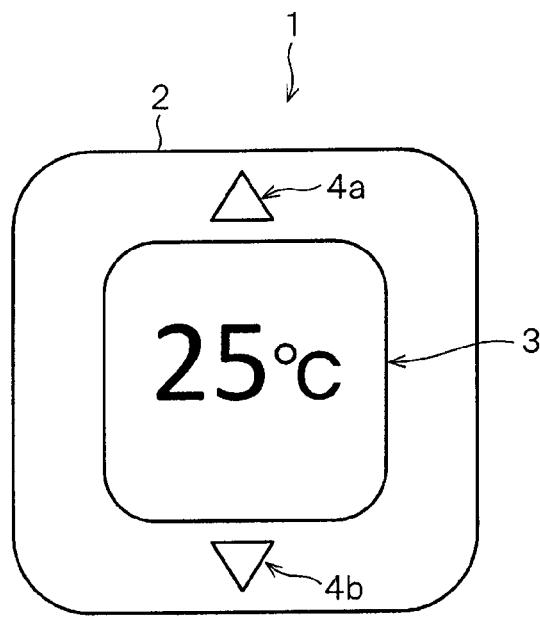
FIG. 1A is a schematic front view illustrating an appearance of an operation device according to an embodiment.
Figure 1B:
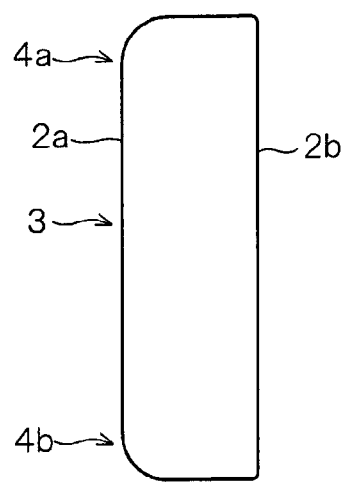
FIG. 1B is a schematic side view illustrating the operation device of the embodiment.

An embodiment is described referring to FIGS. 1-13. As shown in FIGS. 1A and 1B, an operation device 1 includes a casing 2, a display part 3, and operation elements 4a and 4b. The casing 2 has an approximately rectangular parallelepiped shape. The display part 3 and the operation elements 4a and 4b are formed on a front surface 2a of the casing 2. In this embodiment, the display part 3 and the operation elements 4a and 4b are formed in plane mount flush mutually. That is, the operation elements 4a and 4b are formed in the plane continuing from the front surface 2a of the casing 2. The operation elements 4a and 4b are formed integrally with the casing 2, and is not displaced relative to the casing 2.

The plane shape, in this specification, means the flush state as described above, and also means a state where the plane has some unevenness or inclination which originates from the design property. That is, an operation element formed in a plane continuing from the front surface 2a of the casing 2 does not always mean a completely flat state. A direction extending from the front surface 2a to a rear surface 2b of the casing 2 is defined as a front-rear direction.

Figure 2:
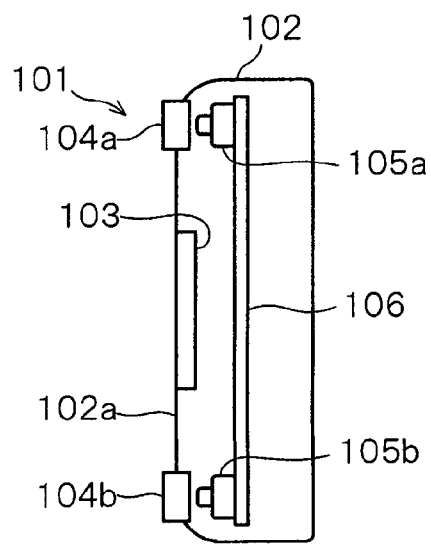
FIG. 2 is a schematic view illustrating a general operation device of a comparison example.

FIG. 2 illustrates a general operation device 101 of a comparison example. The general operation device 101 includes a casing 102, a display part 103, operation elements 104a and 104b (e.g., key-top), baton (tactile) switches 105a (corresponding to a mechanical switch), and a substrate 106 on which the baton switches 105a and 105b are mounted. In the general operation device 101, the operation element 104a, 104b may be a membrane element or push-type element. That is, the operation elements 104a and 104b are movable relative to the casing 102 in the front-rear direction.

In the general operation device 101, when the operation element 104a, 104b is operated, the operation element 104a, 104b moves toward the corresponding baton switch 105a, 105b. Thereby, the operation element 104a, 104b approaches the baton switch 105a, 105b, and turns on the baton switch 105a, 105b. However, in the general operation device 101, the front surface 102a is not flush with the operation element 104a, 104b, because it is necessary to move the operation element 104 in the front-rear direction. For this reason, in the general operation device 101, as described above, a crud may be accumulated around the operation element 104a, 104b.

Figure 3A:
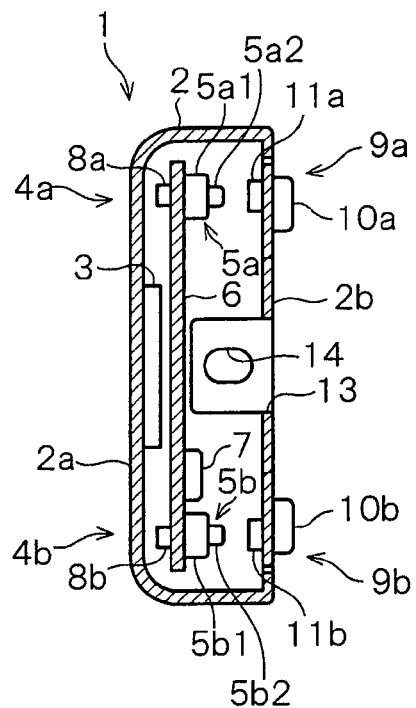
FIG. 3A is a schematic sectional view illustrating the operation device of the embodiment.
Figure 3B:
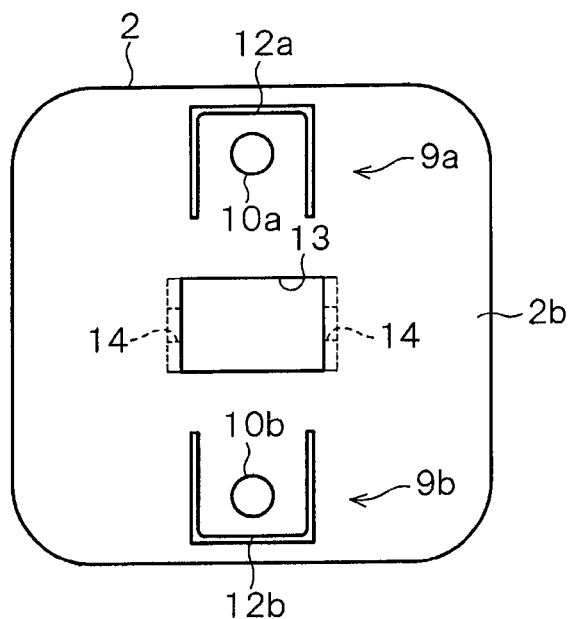
FIG. 3B is a schematic rear view illustrating the operation device of the embodiment.

In contrast, the operation device 1 of this embodiment, as shown in FIG. 3A, includes the baton switches 5a and 5b (equivalent to a mechanical switch) opposing to the rear surface 2b. The operation elements 4a and 4b are arranged at positions symmetrical in the up-down direction and symmetrical in the left-right direction relative to the casing 2. The baton switches 5a and 5b are arranged corresponding to the operation elements 4a and 4b.

Figure 4A:
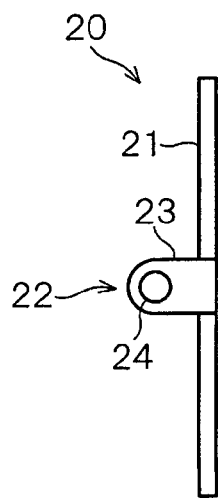
FIG. 4A is a schematic side view illustrating a bracket of the operation device of the embodiment.
Figure 4B:
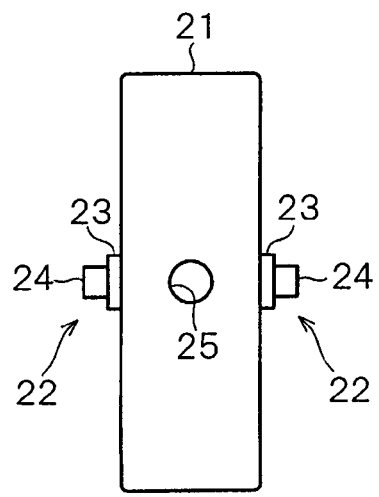
FIG. 4B is a schematic rear view illustrating the bracket of the operation device of the embodiment.

Compared with the general operation device 101, in this embodiment, the baton switch 5a, 5b of the operation device 1 includes a holding part 5a1, 5b2 fixed to the substrate 6, and a flexible region 5a2, 5b2 opposing to the rear surface 2b and a bracket 20 (refer to FIGS. 4A and 4B). The baton switch 5a, 5b is fixed to the substrate 6 in the state where the flexible region 5a2, 5b2 opposes to the rear surface 2b and the bracket 20.

The position of the substrate 6 is fixed inside the casing 2. Therefore, the positions of the baton switches 5a and 5b which are fixed on the substrate 6 are also fixed inside the casing 2. As described above, the operation elements 4a and 4b are formed integrally with the casing 2. For this reason, in the operation device 1, the distance between the operation element 4a, 4b and the baton switch 5a, 5b is fixed, while a distance between the operation element 104a, 104b and the baton switch 105a, 105b is not fixed in the general operation device 101. In this embodiment, the operation element 4a, 4b does not move toward the baton switch 5a, 5b.

Moreover, an internal battery 7, LED 8a, 8b, and a control part (not shown) such as microcomputer are fixed on the substrate 6. The internal battery 7 supplies the power to the operation device 1. LED 8a, 8b emits light when the operation element 4a, 4b is operated to turn on the baton switch 5a, 5b.

The casing 2 has flaps 9a and 9b (equivalent to a pressing part and a biasing part) located on the rear side of the baton switches 5a and 5b, respectively.

The flap 9a, 9b includes a stud 10a, 10b and a spacer 11a, 11b. The studs 10a and 10b are disposed on the rear surface 2b, and are projected rearward (rightward in FIG. 3A) from the rear surface 2b. The spacers 11a and 11b (equivalent to pressing part) are projected frontward (leftward in FIG. 3A) from the internal surface of the casing 2 opposite from the rear surface 2b. The spacers 11a and 11b may be not indispensable, and may be adopted when the distance between the flap 9a, 9b and the baton switch 5a, 5b is insufficient.

The rear surface 2b has slot 12a and 12b which form the flaps 9a and 9b, respectively, where a part of the flap 9a, 9b is connected with the rear surface 2b. The rear surface 2b of the casing 2 is made of elastic material such as resin material. Therefore, the flap 9a, 9b is elastically deformable toward the inside of the casing 2. When the flaps 9a and 9b are elastically deformed toward the inside of the casing 2, the flap 9a, 9b presses the baton switch 5a, 5b from the side of the rear surface 2b.

A fitting hollow 13 is formed in the rear surface 2b, and is recessed toward the inner side of the casing 2 from the rear surface 2b. A fitting hole 14 is formed in the wall part of the fitting hollow 13. The fitting hole 14 (corresponding to a support part) has an oval shape in which the dimension is larger in the front-rear direction of the casing 2 than in the up-down direction perpendicular to the front-rear direction.

As shown in FIGS. 4A and 4B, the bracket 20 includes a board 21 having a plate shape. A fitting part 22 projected from the board 21 is inserted into the fitting hollow 13. The fitting part 22 of the bracket 20 has an arm part 23 and a fitting protrusion part 24 (corresponding to a support part). The arm part 23 is projected from the board 21 toward the casing 2. The fitting protrusion part 24 has a cylindrical shape projected outward from the arm part 23.

The arm part 23 is made of elastic material such as resin material, and has a dimension slightly smaller than the fitting hollow 13. The height of the arm part 23 is set such that the flap 9a, 9b is elastically deformable in the state where the operation element 4a, 4b is not operated, and that the spacer 11 cannot touch the baton switch 5a, 5b in the state where the operation element 4a, 4b is not operated. The diameter of the fitting protrusion part 24 is slightly smaller than that of the fitting hole 14.

Therefore, when the arm part 23 is elastically deformed inward (toward the center of the board 21), the fitting part 22 which has the fitting protrusion part 24 projected outward from the arm part 23 can be inserted in the fitting hollow 13. The fitting protrusion part 24 is fitted with the fitting hole 14 of the casing 2 in the state where the fitting part 22 is inserted in the fitting hollow 13. The fitting part 22 and the fitting hole 14 configure a support part.

Figure 5:
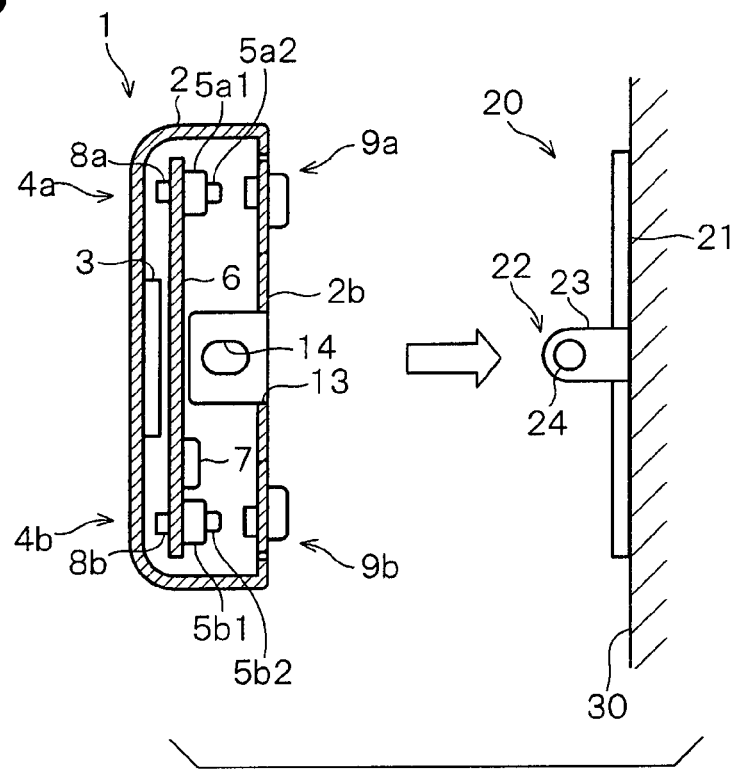
FIG. 5 is a schematic view illustrating the operation device to be attached to the bracket.
Figure 6:
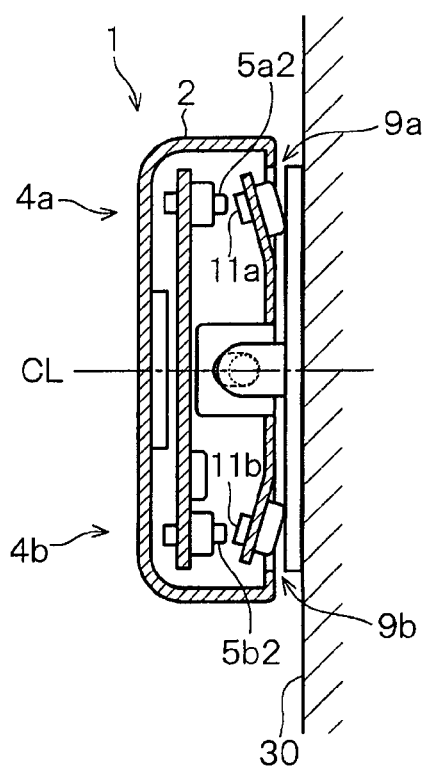
FIG. 6 is a schematic view illustrating the operation device attached to the bracket.

As shown in FIG. 5, the casing 2 of the operation device 1 is attached to the bracket 20 that is attached to the wall surface 30. As shown in FIG. 6, the flap 9a, 9b is elastically deformed toward the inside of the casing 2, in the state where the casing 2 is attached to the bracket 20, because the stud 10 is projected rearward from the rear surface 2b and because the projection amount of the stud 10 is larger than the clearance between the casing 2 and the bracket 20 in the state where the fitting hole 14 and the fitting protrusion part 24 are fitted with each other. However, in this state, the spacer 11a, 11b and the flexible region 5a2, 5b2 of the baton switch 5a, 5b are not in contact with each other. Moreover, in this state, the flap 9a, 9b is able to be further elastically deformed.

When the flap 9a, 9b is elastically deformed, the flap 9a, 9b tries to return to the original state (refer to FIG. 5). The flap 9a, 9b trying to return to the original state applies the biasing force biasing the casing 2 to move away from the bracket 20. That is, the flap 9a, 9b functions also as a biasing part biasing the casing 2. In this case, the casing 2 does not move toward the bracket 20, unless a power exceeding the biasing force of the flap 9a, 9b is added. Thereby, the spacer 11a, 11b and the flexible region 5a2, 5b2 of the baton switch 5a, 5b can be maintained not in contact with each other. Moreover, since the flaps 9a and 9b are formed to correspond to the operation elements 4a and 4b, the casing 2 can be prevented from rattling.

The casing 2 is supported by the fitting between the fitting hole 14 and the fitting protrusion part 24. The fitting hole 14 has the oval shape, and the fitting protrusion part 24 is formed cylindrical. Therefore, the casing 2 is able to tilt relative to the bracket 20 when a power which exceeds the biasing force of the flap 9a, 9b is applied, while the casing 2 is regulated from moving in the up-and-down direction. In other words, the casing 2 is supported to be able to tilt relative to the flap 9a, 9b corresponding to a pressing part.

Moreover, the casing 2 is able to move frontward and rearward in the front-rear direction when a power which exceeds the biasing force of the flaps 9a, 9b is applied, since the fitting hole 14 has the dimension larger in the front-rear direction that is parallel with the central line CL shown in FIG. 6 than in the other direction. In other words, the casing 2 is supported to be able to move to both sides in the front-rear direction relative to the flap 9a, 9b (pressing part).

That is, the positional relationship between the casing 2 and the flap 9a, 9b, i.e., the positional relationship between the baton switch 5a, 5b and the spacer 11a, 11b can be changed by applying the power which exceeds the biasing force of the flap 9a, 9b in the operation device 1. In other words, the orientation of the casing 2 on which the operation elements 4a and 4b are formed can be changed relative to the wall surface 30, and the distance between the casing 2 (i.e., the operation element 4a, 4b) and the wall surface 30 can be changed. That is, the casing 2 is supported by the support part configured by the fitting hole 14 and the fitting protrusion part 24 so as to be able to tilt relative to the attachment surface such as the wall surface 30, and so as to be able to move bidirectionally toward and away from the attachment surface.

Figure 7:
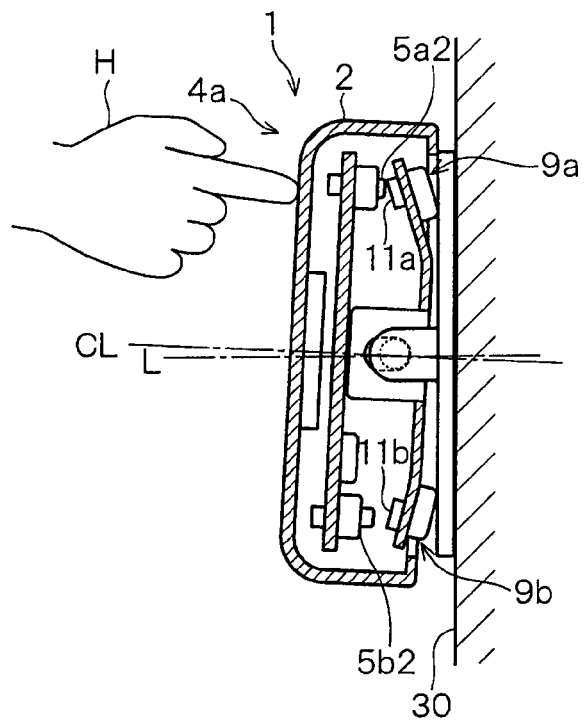
FIG. 7 is a schematic view illustrating an operation state in which an operation element of the operation device is operated.

Therefore, as shown in FIG. 7, when a user operates the operation element 4a by the hand (finger) H to apply the power which exceeds the biasing force to the operation element 4a, the flap 9a is further elastically deformed from the attachment state shown in FIG. 6. As a result, the distance between the spacer 11a and the baton switch 5a becomes small, and the flexible region 5a2 is pressed by the spacer 11a. That is, the baton switch 5a is turned on by operating the operation element 4a. At this time, a user can feel that the finger clicks the baton switch 5a.

Figure 8:
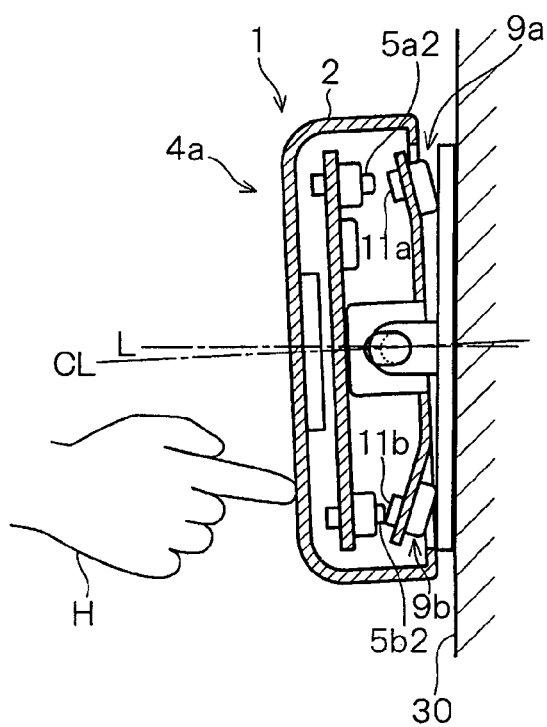
FIG. 8 is a schematic view illustrating an operation state in which an operation element of the operation device is operated.

Similarly, when a user operates the operation element 4b by the hand H, as shown in FIG. 8, to apply the power which exceeds the biasing force to the operation element 4b, the flap 9b is further elastically deformed from the attachment state shown in FIG. 6. As a result, the distance between the spacer 11b and the baton switch 5b becomes small, and the flexible region 5b2 is pressed by the spacer 11b. That is, the baton switch 5b is turned on by operating the operation element 4b. At this time, a user can feel that the finger clicks the baton switch 5b.

Figure 9:
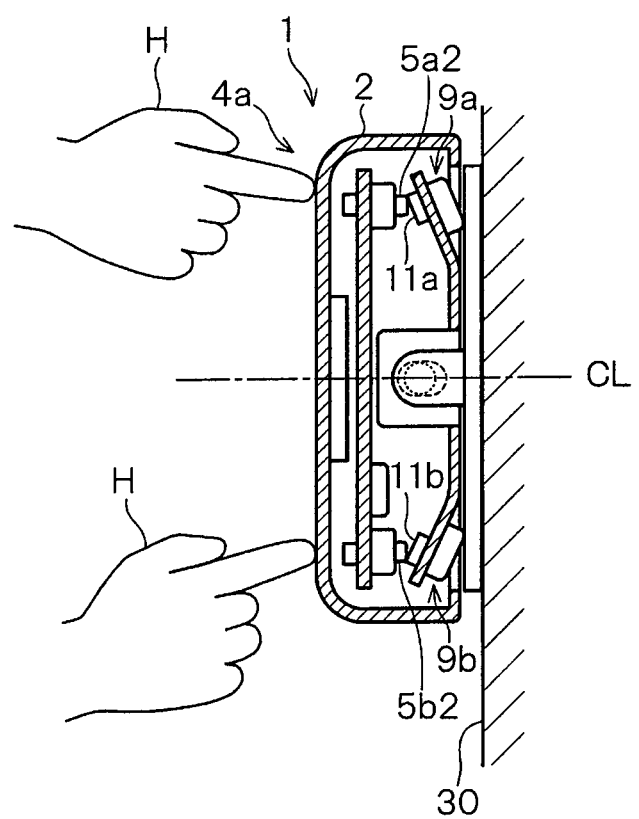
FIG. 9 is a schematic view illustrating an operation state in which operation elements of the operation device are operated.

Furthermore, as shown in FIG. 9, when a user operates simultaneously the operation elements 4a and 4b by the hands H to apply the power which exceeds the biasing force to the operation elements 4a and 4b, the flaps 9a and 9b are further elastically deformed from the attachment state shown in FIG. 6. As a result, the distance between the spacer 11a, 11b and the baton switch 5a, 5b becomes small, and the flexible regions 5a2 and 5b2 are pressed by the spacers 11a and 11b respectively. That is, both the baton switches 5a and 5b are turned on by operating simultaneously the operation elements 4a and 4b. At this time, a user can feel that the fingers click the baton switches 5a and 5b respectively. In addition, both the baton switches 5a and 5b can be similarly turned on by pushing the neighborhood of the display part 3 strongly.

Thus, the baton switches 5a and 5b can be operated when the casing 2 and the operation elements 4a and 4b are integrally tilted or displaced relative to the attachment surface.

According to the embodiment, the operation device 1 driven by the internal battery 7 includes the casing 2, the operation elements 4a and 4b, the mechanical switch (baton switches 5a and 5b), the pressing part (the flap 9a, 9b, the spacer 11a, 11b), the support part (the fitting hole 14, fitting part 22), and the biasing part (the flap 9a, 9b, the stud 10a, 10b). The operation element 4a, 4b is formed in the plane continuing from the front surface 2a of the casing 2. The mechanical switch is arranged in the casing 2 such that the distance between the mechanical switch and the operation element 4a, 4b is fixed. The flexible region 5a2, 5b2 of the mechanical switch is located to oppose to the rear surface 2b of the casing 2. The pressing part is located between the mechanical switch and the attachment surface (wall surface 30), and presses the flexible region from a reverse side opposite from the operation element 4a, 4b. The support part supports the casing 2 such that the distance between the operation element 4a, 4b and the attachment surface is changeable. The biasing part biases the casing 2 to move away from the attachment surface.

Thereby, the front surface 2a of the casing 2 on which the operation elements 4a and 4b are formed can be formed flat. Since a big level difference is not generated between the operation element 4a, 4b and the front surface 2a, crud can be restricted from adhering to the operation element 4a, 4b. Moreover, the front surface 2a of the casing 2 can be easily cleaned by wiping. Therefore, the good appearance can be kept.

Moreover, since the mechanical switch detects operations to the operation elements 4a and 4b, it is not always necessary to detect whether an electrostatic switch is operated. The power consumption of electric circuit such as control part can be sharply reduced. Therefore, consumption of the internal battery 7 can be reduced. Moreover, since consumption of the internal battery 7 can be controlled, the internal battery 7 can be used for a long period, and user's burden such as replacement of the battery can also be reduced.

The support part of the operation device 1 supports the casing 2 to be able to tilt relative to the attachment surface and to be able to move in the both directions approaching and separating from the attachment surface. Therefore, in case where the operation elements 4a and 4b are arranged in a direction in which the casing 2 tilts, the operation elements 4a and 4b can be operated individually. The operation device 1 can be used, for example, in a case where plural operation elements are needed for raising the set temperature and for lowering the set temperature. Moreover, the plural operation elements 4a and 4b can be simultaneously operated by supporting the casing 2 to be able to move in the both directions. Therefore, it is not necessary to increase the operation elements.

The support part is configured by the cylindrical fitting protrusion part 24 and the fitting hole 14 fitted with each other. The fitting hole 14 is formed in the oval shape having a dimension larger in the front-rear direction of the casing 2 than in the other direction. Thereby, tilting and bidirectional movement of the casing 2 are attained with a simple structure.

The flap 9a, 9b corresponds to the biasing part, and is simply realized with the stud 10a, 10b and the slot 12a, 12b defined in the rear surface 2b of the casing 2. Therefore, the structure of the operation device 1 is not complicated.

In the comparison example shown in FIG. 2, the operation element 104a, 104b moves and contacts the baton switch 105a, 105b in the general operation device 101. The general operation device 101 needs a light-introducing component because LED lighting the operation element 104a, 104b cannot be arranged directly next to the operation element 104a, 104b.

In contrast, according to the embodiment, a space is secured on the rear side of the operation element 4a, 4b by uniting the operation element 4a, 4b with the casing 2. LED 8a, 8b can be arranged directly next to the operation element 4a, 4b, without using a light-introducing component in the operation device 1.

The baton switches 5a and 5b are mounted on the substrate 6. The control part is mounted on the substrate 6. For this reason, a cable which connects the baton switches 5a and 5b to the control part is unnecessary. Thereby, the number of components can be reduced, and durability and reliability can be raised by avoiding the cable from being damaged due to the repetition operations.

The above embodiment may be modified as follows.

Figure 10:
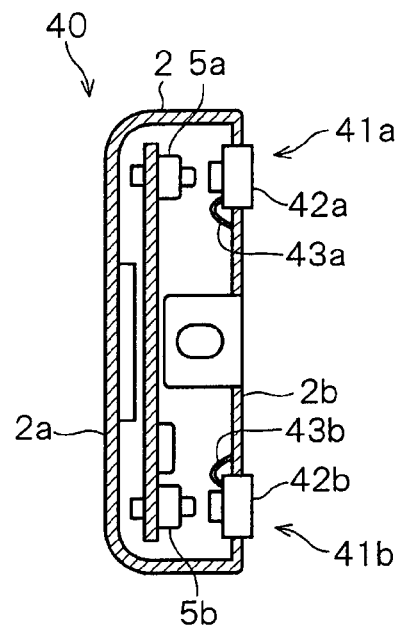
FIG. 10 is a schematic view illustrating a modification of the operation device.

For example, as shown in FIG. 10, the operation device 40 may have pressing and biasing parts 41a and 41b functioning as both of the pressing part and the biasing part. In this case, similarly to the embodiment, the operation elements 4a and 4b are formed in the plane continuing from the front surface 2a of the casing 2. The support part has a similar structure as in the embodiment.

The pressing and biasing part 41a, 41b is configured by the studs 42a, 42b and the spring component 43a, 43b. A part of the stud 42a, 42b is projected from the rear surface 2b of the casing 2, and a part of the stud 42a, 42b is located in the casing 2, when not attached to the attachment surface. In addition, the stud 42a, 42b may have a spacer. The spring components 43a and 43b bias the studs 42a and 42b rearward (rightward in FIG. 10) respectively.

When the casing 2 of FIG. 10 is attached to the bracket 20, the orientations of the studs 42a and 42b change relative to the spring components 43a and 43b respectively. Moreover, when the orientation of the stud 42a, 42b changes, the casing 2 is biased frontward (leftward in FIG. 10). Therefore, the similar advantages can be obtained as the embodiment. Specifically, while a good appearance is maintained, consumption of the internal battery 7 can be reduced.

Figure 11:
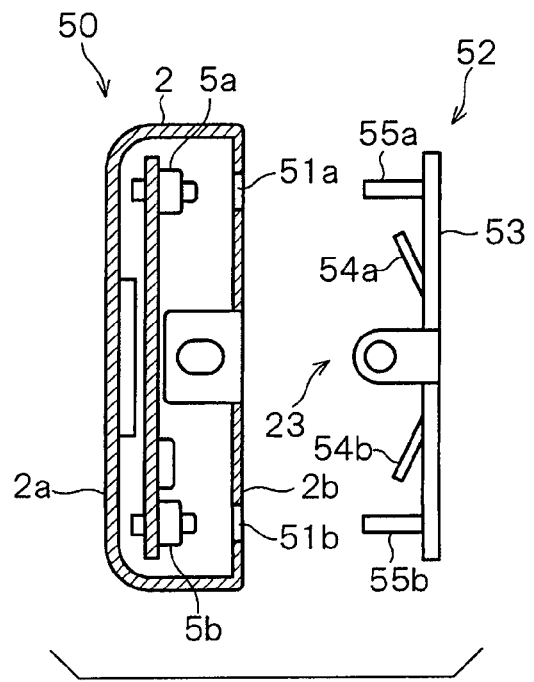
FIG. 11 is a schematic view illustrating a modification of the operation device of the embodiment.

As shown in FIG. 11, a rear wall of the casing 2 of the operation device 50 has through holes 51a and 51b at the position corresponding to the baton switches 5a and 5b. The board 53 of the bracket 52 has a biasing part 54a, 54b and a pressing part 55a, 55b which presses the baton switch 5a, 5b. The support part may have a similar structure as in the embodiment. That is, the bracket 52 includes the biasing part 54a, 54b and the pressing part 55a, 55b.

When the casing 2 of FIG. 11 is attached to the bracket 52, the casing 2 can be biased frontward, and the baton switches 5a and 5b can be operated from the side of the rear surface 2b by operating the operation elements 4a and 4b respectively. Therefore, the similar advantages can be obtained as the embodiment. Specifically, while a good appearance is kept, consumption of the internal battery 7 can be reduced.

Figure 12:
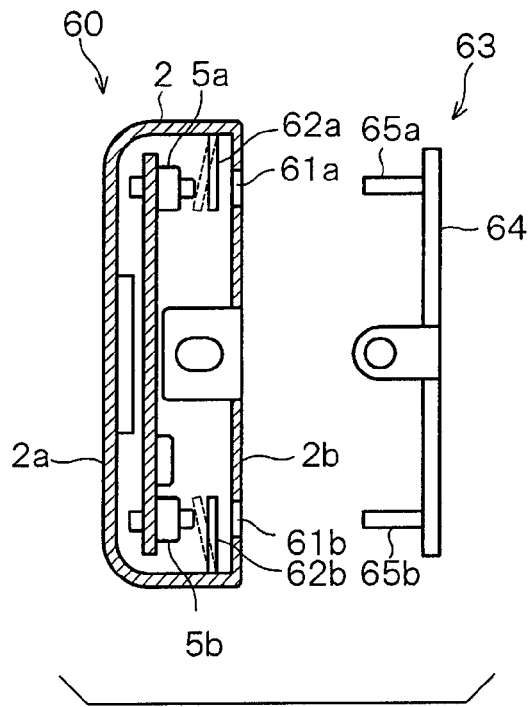
FIG. 12 is a schematic view illustrating a modification of the operation device of the embodiment.

Moreover, as shown in FIG. 12, the operation device 60 has the through holes 61a and 61b in the rear wall of the casing 2. Further, the casing 2 includes the biasing parts 62a and 62b inside the casing 2. The bracket 63 has the pressing parts 65a and 65b projected from the board 64. That is, the biasing part 62a, 62b is arranged in the casing 2, and the bracket 63 has the pressing part 65a, 65b. In this case, the similar advantages can be obtained as the embodiment. Specifically, while a good appearance is maintained, consumption of the internal battery 7 can be reduced.

Although illustration is omitted, a biasing part may be defined in the bracket 63, and a pressing part may be defined in the casing 2. In this case, the similar advantages can be obtained as the embodiment. Moreover, the length of the flexible region 5a2, 5b2 of the baton switch 5a, 5b may be increased so as to be projected from the rear surface 2b of the casing 2, and the projected portion may be used as a pressing part.

Figure 13:
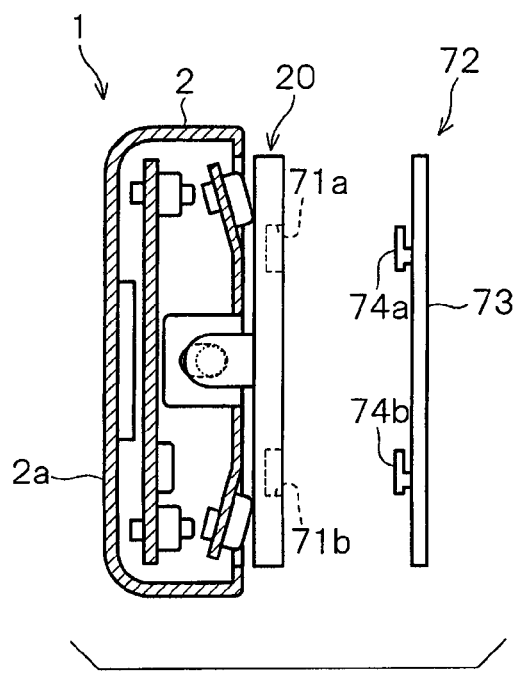
FIG. 13 is a schematic view illustrating a modification of the operation device of the embodiment.

Moreover, as shown in FIG. 13, the operation device 1 and the bracket 20 may be united as one-piece member which can be detached from and attached to an attachment member 73. In this case, groove portions 71a and 71b are formed in a rear surface of the bracket 20, and the board 72 of the attachment member 73 has the protrusion parts 74a and 74b. In this case, the similar advantages can be obtained as the embodiment. Specifically, while a good appearance is maintained, consumption of the internal battery 7 can be reduced.

Figure 14:
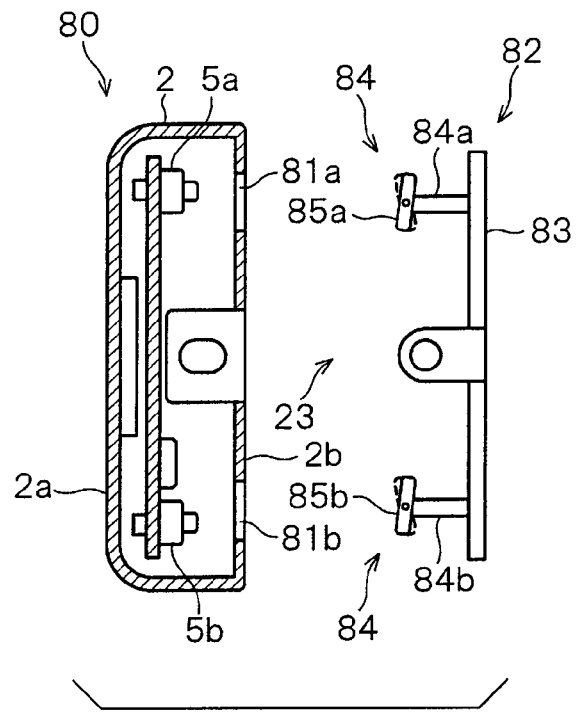
FIG. 14 is a schematic view illustrating a modification of the operation device of the embodiment.

Moreover, as shown in FIG. 14, the bracket 82 has the pressing part 84. The pressing part 84 has a base part 84a, 84b extending from the board 83 toward the baton switch 5a, 5b, and a tilting component 85a, 85b. The tilting component 85a, 85b is defined at the tip end of the base part 84a, 84b, and presses the baton switch 5a, 5b by tilting when contacting the baton switch 5a, 5b.

Figure 15:
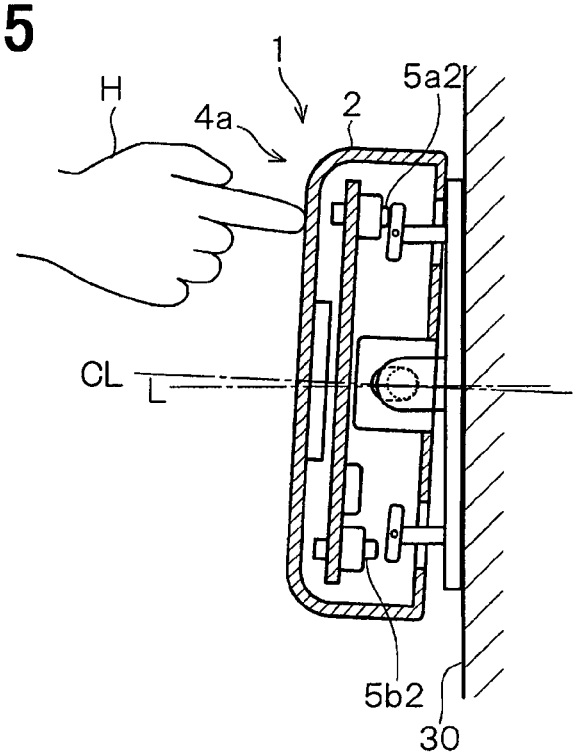
FIG. 15 is a schematic view illustrating an operation state in which an operation element of the operation device of FIG. 14 is operated.

As shown in FIG. 15, when the operation element 4a is operated by the hand H of a user, the casing 2 tilts, and the baton switch 5a and the tilting component 85a are in contact with each other. At this time, the tilting component 85a tilts and contacts the baton switch 5a in parallel state, and the flexible region 5a2 is pressed along the movable direction. In addition, the tilting range of the tilting component 85a, 85b is set as a range where the baton switch 5a, 5b can be pressed.

Thereby, the contact can be certainty secured. When the bracket 83 further includes the biasing part 54a shown in FIG. 11, the casing 2 can be supported in the biased state biased to the front side. Thus, the casing can be restricted from rattling or vibrating. Further, a good appearance is maintained, and consumption of the internal battery can be reduced.

The mechanical switch is not limited to the baton switch by which a feeling of operation is easily obtained. Other switch other than the baton switch may be used as a mechanical switch.

The casing 2 has the fitting hole 14, and the bracket 20 has the fitting protrusion part 24 in the embodiment. The casing 2 may have the fitting protrusion part 24, and the bracket 20 may have the fitting hole 14.

The support part supports the casing 2 to be able to tilt and move in both directions relative to the attachment surface in the embodiment. The support part may support the casing 2 to be able to tilt or move in both directions relative to the attachment surface.

The biasing part is formed as a part of the casing 2 in the embodiment. Alternatively, a biasing part may be made separately, and may be made of elastic component such as spring or rubber. The biasing part may be made of other material such as metal material or resin material. Neither the number nor arrangement of operation elements is limited to those in the embodiment.

According to the embodiment, the support part supports the casing to be able to tilt relative to the attachment surface so as to bidirectionally move in a direction toward the attachment surface and in a direction away from the attachment surface. Therefore, when two operation elements are arranged in a direction in which the casing tilts, the two operation elements can be operated individually. The operation device can be used, for example, in a case where plural operation elements are needed for controlling a temperature to rise or descent. The plural operation elements can be operated simultaneously, when the casing is supported to be able to have bidirectional movements.

According to the embodiment the support part has a cylindrical fitting protrusion part and a fitting hole fitted to each other. The fitting hole has an oval shape having a dimension larger in the front-rear direction of the casing than in the other direction. Thereby, tilting and bidirectional movement of the casing can be realized with a simple structure.

According to the embodiment, the operation device further includes a biasing part biasing the casing away from the attachment surface. Therefore, when the operation device is not operated, the casing can be prevent from vibrating or rattling by being biased frontward away from the attachment surface.

According to the embodiment, the casing is attached to the attachment surface through a bracket, and the biasing part is defined on the bracket. Therefore, the structure of the casing can be simplified, and a space needed in the casing can be made small. Therefore, the size of the casing can be restricted from increasing.

According to the embodiment, the casing is attached to the attachment surface through a bracket, and the pressing part is defined in the bracket. Therefore, the structure of the casing can be simplified, and a space needed in the casing can be made small. Therefore, the size of the casing can be restricted from increasing.

According to the embodiment, the pressing part includes: a base part defined in the bracket and extending toward the mechanical switch; and a tilting component located at a tip end of the base part. The tilting component tilts and presses the mechanical switch by contacting with the mechanical switch. When the operation element is operated to make the mechanical switch and the tilting component in contact with each other, the tilting component tilts such that the mechanical switch is pressed along the movable direction of the flexible region. Therefore, the mechanical switch can be operated certainly by the contact between the tilting component and the flexible region.

Such changes and modifications are to be understood as being within the scope of the present disclosure as defined by the appended claims.

What is claimed is:

1. An operation device driven by an internal battery, the operation device comprising:
   a casing;
   an operation element located on a plane continuing from a front surface of the casing;
   a mechanical switch disposed in the casing such that a distance between the mechanical switch and the operation element is fixed, the mechanical switch having a flexible region located to oppose to a rear surface of the casing;
   a pressing part located between the mechanical switch and an attachment surface, the pressing part pressing the flexible region from a side of the flexible region opposite a side of the flexible region closest to the operation element;
   a support part that supports the casing such that a distance between the operation element and the attachment surface is changeable; and
   a biasing part biasing the casing away from the attachment surface,
   wherein:
   the support part has a cylindrical fitting protrusion part and a fitting hole fitted to each other,
   the fitting hole has an oval shape having a dimension larger in a front-rear direction of the casing than in the other direction, and
   the pressing part and the mechanical switch are maintained not to be in contact with each other until a force exceeding a biasing force of the biasing part is applied.

2. The operation device according to claim 1, wherein the support part supports the casing to be able to tilt relative to the attachment surface so as to move in both directions toward and away from the attachment surface.

3. The operation device according to claim 1, wherein the casing is attached to the attachment surface through a bracket, and the bracket includes the biasing part.

4. The operation device according to claim 1, wherein
   the casing is attached to the attachment surface through a bracket, and
   the bracket includes the pressing part.

5. The operation device according to claim 1, wherein
   the pressing part includes:
   a base part extending toward the mechanical switch; and
   a tilting component located at a tip end of the base part,
   the tilting component tilts and presses the mechanical switch by contacting with the mechanical switch,
   the casing is attached to the attachment surface through a bracket, and
   the bracket includes the base part.

* * * * *